(12) United States Patent
Williams et al.

(10) Patent No.: US 6,210,982 B1
(45) Date of Patent: Apr. 3, 2001

(54) METHOD FOR IMPROVING SPATIAL RESOLUTION AND ACCURACY IN SCANNING PROBE MICROSCOPY

(75) Inventors: Clayton C. Williams, Salt Lake City; Jeffrey S. McMurray, South Kaysville, both of UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 09/116,803

(22) Filed: Jul. 16, 1998

Related U.S. Application Data
(60) Provisional application No. 60/052,657, filed on Jul. 16, 1997.

(51) Int. Cl.$^7$ .............................. G01R 31/26; H01L 21/66
(52) U.S. Cl. .................................. 438/14; 438/18; 438/17
(58) Field of Search .................................. 438/14, 17, 18; 324/765, 662

(56) References Cited

U.S. PATENT DOCUMENTS

| | | | |
|---|---|---|---|
| 5,065,103 | 11/1991 | Slinkman et al. | 324/458 |
| 5,520,769 | 5/1996 | Barrett et al. | 156/626.1 |
| 5,523,700 | * 6/1996 | Williams et al. | 324/765 |
| 5,585,734 | 12/1996 | Meuris et al. | 324/719 |
| 5,995,912 | * 11/1999 | DeWolf et al. | 702/85 |

* cited by examiner

*Primary Examiner*—Richard Elms
*Assistant Examiner*—Bradley K. Smith
(74) *Attorney, Agent, or Firm*—Morriss, Bateman, O'Bryant & Compagni (57) ABSTRACT

A method and apparatus for generating a spatially improved and accurate dopant density profile of a doped material using scanning probe microscopy, wherein the new method utilizes an iterative process to approach a dopant density profile having a user definable accuracy by creating a new two-dimensional gradient model which accounts for gradients in doping concentrations within the doped material.

26 Claims, 6 Drawing Sheets

Fig. 1
*(PRIOR ART)*

Depletion Region 22   Annular Rings 24

$C_{Tip}$ + Oxide Capacitance $C_{Silicon}$ Capacitance

Inverse Modeling in 2D

Fig. 5A — 2D Test Profile

Fig. 5B — 2D AC Bias Simulation

Fig. 5C — 2D First Order Conversion

Fig. 5D — 2D Second Order Conversion

Fig. 6

METHOD FOR IMPROVING SPATIAL RESOLUTION AND ACCURACY IN SCANNING PROBE MICROSCOPY

This application claims benefit to Provisional Application No. 60/052,657 filed Jul. 16, 1997.

BACKGROUND

1. Field of the Invention

The present invention relates generally to a method and apparatus for determining material properties using scanning microscopy. More specifically, a new method is taught for improving spatial resolution and accuracy of dopant density profiling of materials used in semiconductors when conducting scanning probe microscopy.

2. State of the Art

State of the art integrated circuit technology demonstrates that it is possible to create active and passive electrical and electronic components on a semiconductive substrate at the sub-micron level. This ability requires accurate knowledge of the spatial extent of impurity dopants that are incorporated into the semiconductive substrate. This knowledge is necessary because of the scale at which the concentration, and thus variation or profile of the dopants is operating. Essentially, in order to achieve predictability in active and passive component behavior, it is necessary to be able to accurately measure the dopant density profiles which can then be used by design engineers in design and manufacturing processes. Lack of precision in the incorporation of dopants can result in a proliferation of undesirable defects during later steps in a manufacturing process, and possibly less than adequate performance of the finished product.

Dopant regions are formed by actively injecting or passively diffusing a desired impurity into a surface of the substrate. When dealing with silicon as the semiconducting substrate, a native oxide occurs when the substrate surface is exposed to oxygen. It is possible to implant the dopants through this thin and naturally occurring oxide layer.

After forming active and/or passive components on the semiconductive substrate surface, functionality of the integrated circuit is determined by many factors. One important factor is the concentration of dopant atoms within dopant regions. Therefore, accurate profiling of the substrate is critical for accurate estimates of operating characteristics.

The state of the art is replete with different ways to characterize and thus create a profile of dopant regions. There are many one dimensional dopant profiling techniques, such as secondary ion mass spectroscopy (SIMS), spreading resistance, junction staining and anodic sectioning. Disadvantageously, these methods all fail to provide profiling in two dimensions. However, with the advent of the scanning tunneling microscope and the scanning probe microscope, new methods for dopant profiling became possible on a nanometer scale.

For example, early measurement techniques generally measured resistance and converted each resistance reading to a concentration amount.

Another technique is to profile a cross-section of the substrate which has been severed along the dopant region. Dopant concentration is then measured in two dimensions in both vertical and lateral directions.

Another way to obtain two-dimensional dopant profile measurement and inverse modeling is by scanning capacitance microscopy as disclosed in U.S. Pat. No. 5,523,700. This patent teaches how a one dimensional model is used to extract two dimensional dopant density profiles from measurements made by a scanning capacitance microscope.

Figure 1:
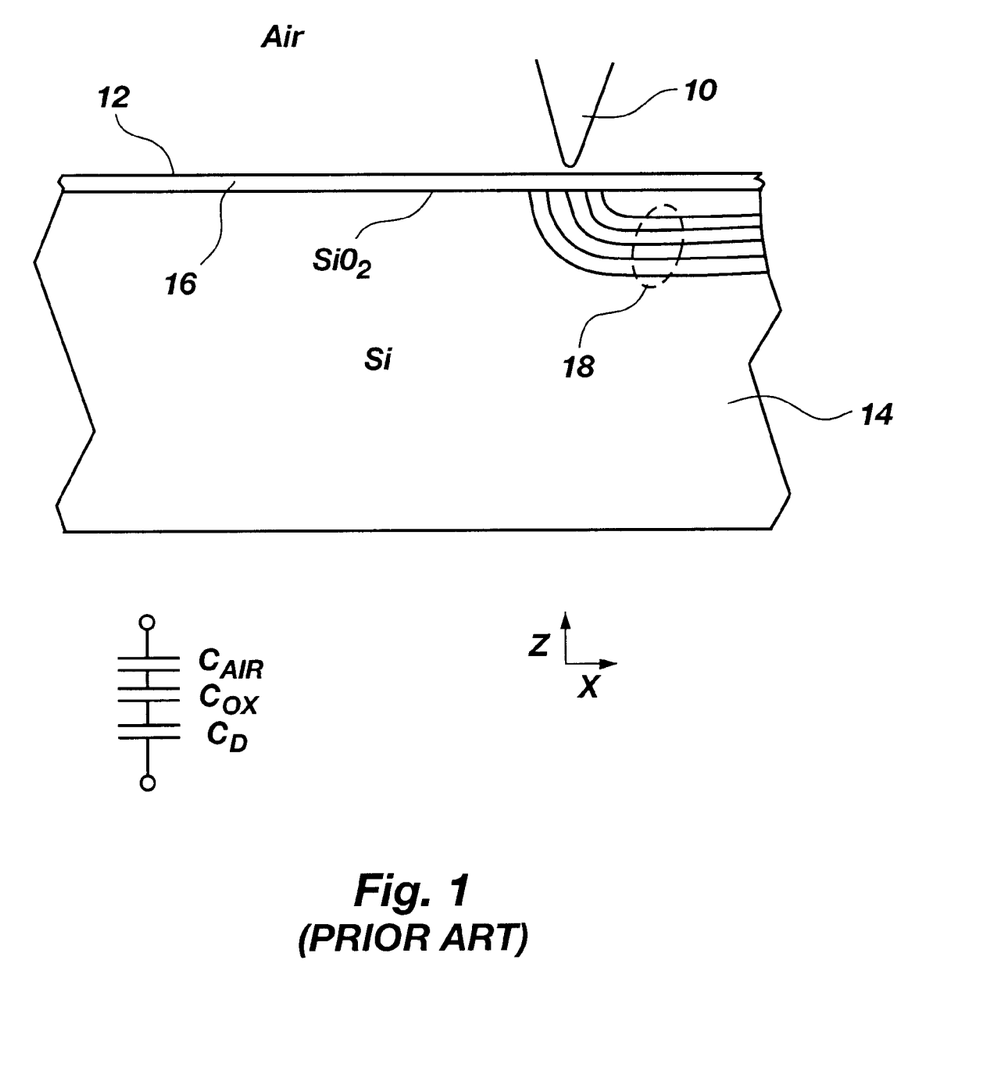
FIG. 1 is an elevational cut-away profile view of a substrate having various dopant densities throughout. This figure is representative of a prior art method of dopant density profiling using scanning probe microscopy.

Finally, one illustrated method as taught in the prior art is shown in FIG. 1. A probe 10 is placed on a surface 12 of a substrate material 14 to be probed. In this example, the substrate material being probed is silicon, with a layer of silicon dioxide 16 (naturally occurring or intentionally disposed thereon) covering the surface. The probe 10 is placed on and moved over the layer of silicon dioxide 16. In this cross-sectional view, the dopant density or carrier concentration is represented in the silicon 14 as concentration contours 18. In this method, the probe 10 is operated in what is referred to as a constant change in capacitance mode. A harmonic AC bias voltage is applied to the probe 10. By measuring the AC voltage necessary to maintain a constant change in depletion capacitance, it is possible to determine dopant concentration using a conversion model and algorithm. The conversion algorithm relates AC bias voltage data to dopant density concentration using a physical model.

The physical model requires particular parameters to be defined in order to accurately represent the system of the substrate 14. These parameters include an oxide dielectric constant, oxide thickness, probe tip radius, pining dopant density, pining bias voltage, and sensor probing voltage. Of these parameters, a free parameter can be the oxide dielectric constant, the oxide thickness, or the sensor probing voltage. The free parameter controls the lowest dopant density generated in the conversion. By fixing the dielectric constant and oxide thickness, it is possible to vary the sensor probing voltage for the best fit of SIMS.

Figure 2:
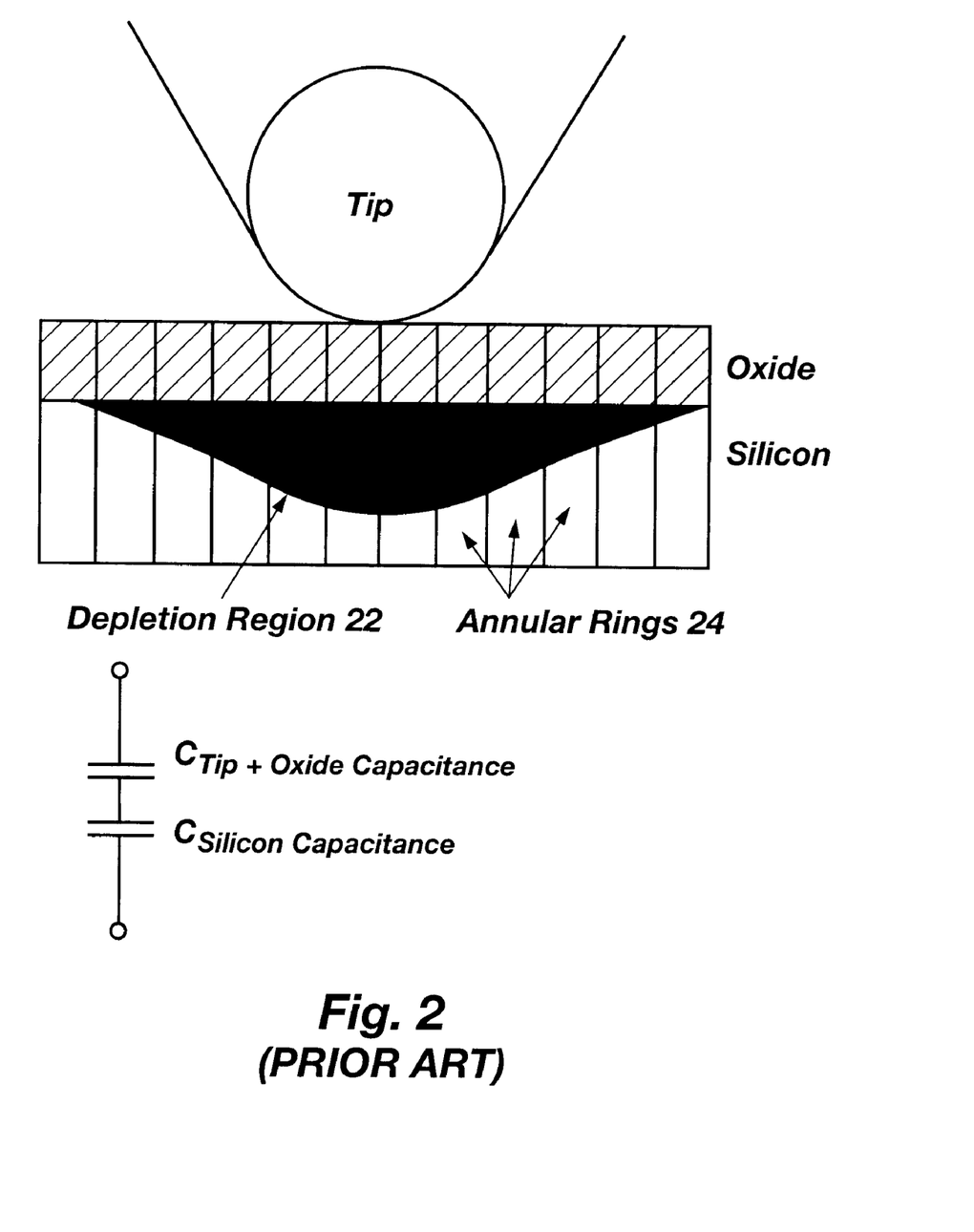
FIG. 2 is a first order model of the material being probed which shows that a state of the art method of dopant density profiling fails to take into account any dopant gradient which may exist in the material being probed, and instead assumes a constant gradient.

FIG. 2 shows that disadvantageously, this method and model fails to take into account any dopant gradient which may exist in the material being probed. For example, the model (referred to as a first order model) incorrectly assumes that the dopant density is constant relative to the position of the probe in the material being probed. This is demonstrated by the depletion region 22 and the annular rings 24. This assumption leads to an AC bias voltage to dopant density physical model which suffers from this inaccuracy.

It is observed in FIG. 2 that for each annular ring, it is necessary to find the following: 1) the probe tip to silicon capacitance, 2) the oxide capacitance, 3) the silicon capacitance, and 4) the capacitance per annular ring 24 which is a series combination of the capacitances of steps 1, 2 and 3. The total capacitance is the sum contribution of all the annular rings 24.

It would be an advantage over the state of the art to provide a new method for determining dopant density profiling which improved spatial resolution and accuracy. It would be a further advantage to provide a method for improved dopant profiling which could account for gradients in dopant density within the substrate being scanned.

OBJECTS AND SUMMARY OF THE INVENTION

It is an object of the present invention to provide a method for improving dopant profiling by increasing spatial resolution in scanning probe microscopy.

It is another object to provide a method for improving dopant profiling by increasing the accuracy of scanning probe microscopy.

It is another object to provide a method for improving dopant profiling by utilizing a new two-dimensional gradient model of interaction between the probe and the surface of the material being probed.

It is another object to utilize an iterative algorithm which utilizes the new two-dimensional gradient model to obtain a calculated dopant density which converges toward the true dopant density.

It is another object to apply this iterative dopant density determination technique for use with other microscopes.

It is another object to determine dopant density using a constant change in capacitance mode of operation of the probe.

It is another object to determine dopant density using a constant AC bias voltage mode of operation of the probe.

The presently preferred embodiment of the present invention is a method and apparatus for generating an accurate dopant density profile of a doped material using scanning probe microscopy, wherein the new method utilizes an iterative process to approach a dopant density profile having a user definable accuracy by creating a new two-dimensional gradient model of doping density within the doped material.

In a first aspect of the invention, the preferred embodiment of the method comprises the new step of utilizing a second order model to calculate a new AC bias voltage of the first order dopant density.

In a second aspect of the invention, the annular rings of the model of the doped material are divided into finite segments, thereby using a first order approximation of the dopant distribution as an input to the second order model.

In a third aspect of the invention, a newly calculated AC bias voltage is compared to a measured AC bias voltage to thereby obtain an error signal.

In a fourth aspect of the invention, the dopant density profile is iteratively adjusted in accordance with the error signal when it is larger than a user defined convergence value.

In a fifth aspect of the invention, the convergence value can be modified for different portions of the dopant density profile.

In a sixth aspect of the invention, the decision to stop the iterative process can be a function of the difference between a current dopant density profile and an immediately previous dopant density profile.

These and other objects, features, advantages and alternative aspects of the present invention will become apparent to those skilled in the art from a consideration of the following detailed description taken in combination with the accompanying drawings.

DETAILED DESCRIPTION OF THE INVENTION

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

The presently preferred method of the present invention is summarized as a new lateral depletion/dopant gradient model and algorithm. However, it is useful to examine this new method and model in the context of the state of the art method of dopant density profiling. Accordingly, this explanation of the presently preferred embodiment of the method begins as follows.

In accordance with what has been previously explained, the first step of the method of improved dopant density profiling is the same as in the state of the art method. Specifically, a tip of a probe is scanned (moved) over a two-dimensional surface of a material being probed. This scanning process is executed in accordance with the constant change in capacitance mode as is understood by those skilled in the art of scanning probe microscopy.

The second step is to take measurements of the AC bias voltage which is required to maintain constant capacitance change in the probe tip. This is done to obtain a corresponding probe capacitance signal. The voltage measurements are recorded as a function of the position of the tip of the probe on the substrate surface.

These first two steps are executed to thereby experimentally acquire AC bias voltage data to be input into a first order model which assumes uniform dopant density under the probe at each point on the material as in the state of the art method.

The third step is also not new. Specifically, a conversion of the probe capacitance signal measured in the second step is calculated to thereby obtain a two dimensional dopant density profile, using the first order model. This provides a first order approximation of the true dopant density that is being measured.

Figure 3A:
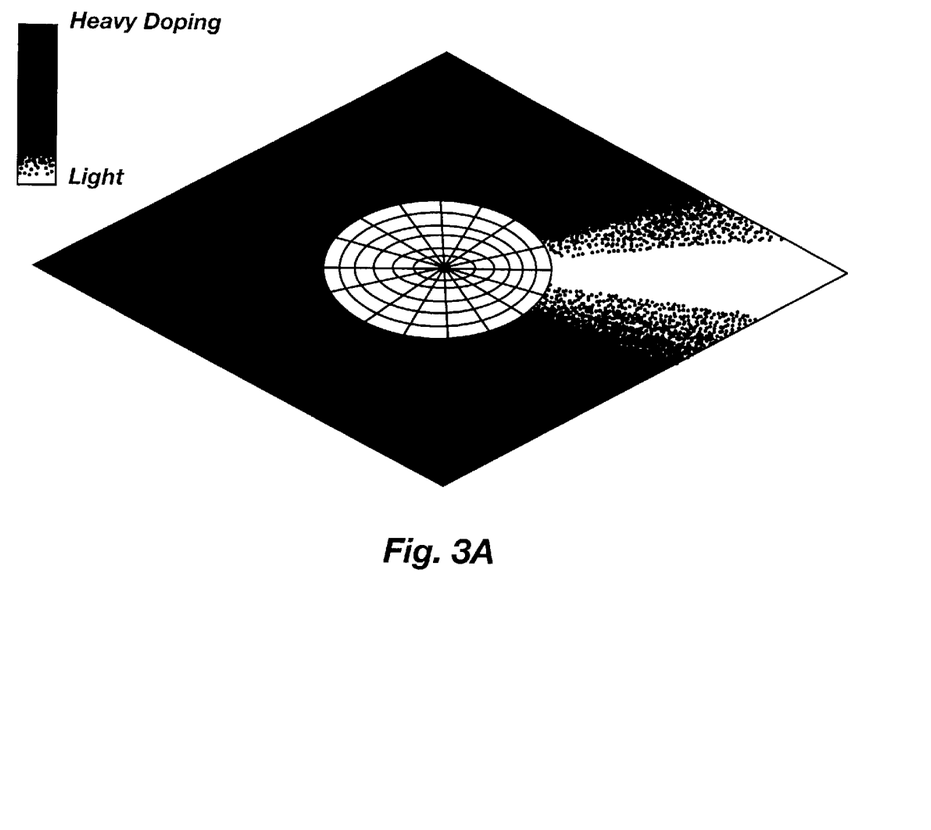
FIG. 3A is a perspective illustration of a possible dopant gradient from heavy to light in a substrate as indicated.
Figure 3B:
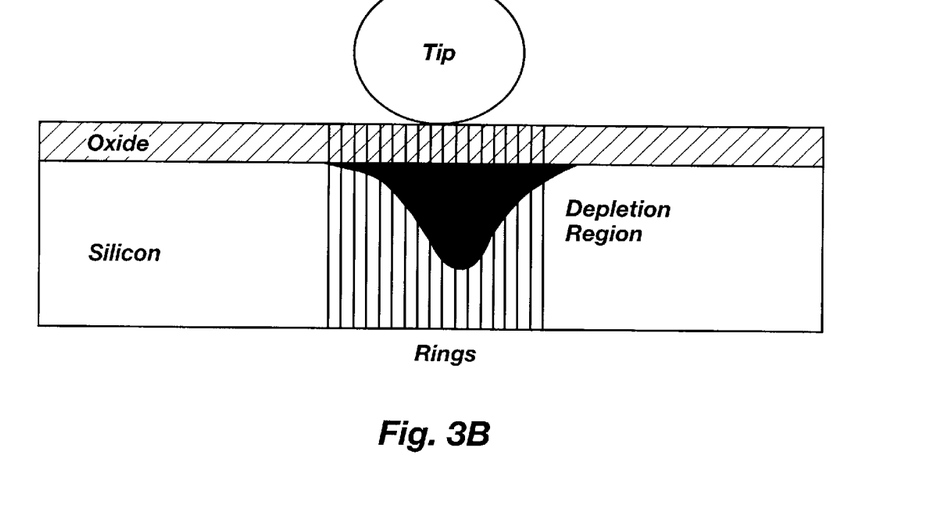
FIG. 3B is an illustration similar to FIG. 2, except that the annular rings are now segmented.

The first new step of the present invention is the fourth step of the presently preferred method. The second order model which has just been calculated is used to calculate a new AC bias voltage for the first order dopant density. This is accomplished using the new two dimensional gradient model of the interaction of the probe tip with the substrate surface. This new two dimensional gradient model breaks the annular rings of dopant density shown in FIG. 2 into finite segments as shown in FIGS. 3A and 3B. FIG. 3A provides an illustration of a possible dopant gradient from heavy to light as indicated. FIG. 3B is an illustration similar to FIG. 2, except that the annular rings are now segmented.

In summary, this fourth step uses the first order approximation of the dopant density distribution as an input to the second order model to calculate the new AC bias voltage. Accordingly, the second order model of the probe (virtual probe) is used to obtain a virtual measurement as the virtual probe is scanned over the dopant density profile, or in other words the first order approximation of the dopant density distribution.

The fifth step is to compare this newly calculated AC bias voltage with the experimentally acquired (measured) AC bias voltage from step two. The dopant density profile is then adjusted according to the percent difference between the two AC bias voltages. Specifically, the signal of the virtual probe is compared with the measured probe signal. The percent difference between the signals is referred to as an error signal.

The sixth step is to adjust the dopant density profile by comparing the magnitude of the error signal at each point to a user defined convergence value. If the error signal at each point (or some average value) is smaller than a predetermined convergence value, the method is complete and the dopant density profile is as accurate as the user required. However, if the error signal is greater than the convergence value, an adjustment is made to the dopant density profile based upon the error signal at each point. It is notable that the user can determine whether the convergence value must be greater for each point, or some user determinable average value can be used.

In summary, the presently preferred embodiment of the present invention takes an iterative approach to converging on a correct dopant density profile, where correctness is defined as whatever convergence value the user desires. Therefore, once the dopant density profile is modified, the method of the present invention keeps returning to the first new step (step four) of the present invention until the error signal is less than the convergence value.

Figure 4:
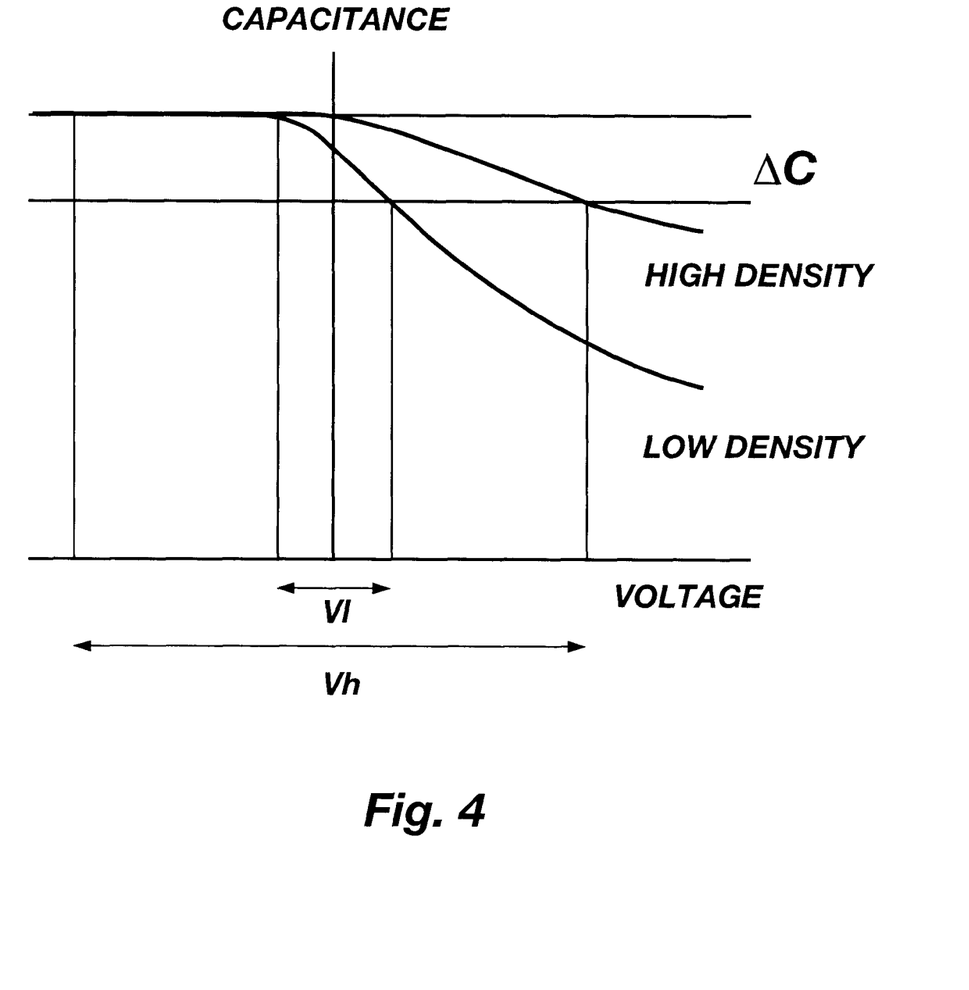
FIG. 4 is a graph showing the AC bias voltage required for a constant change in capacitance for low dopant and high dopant density materials.

FIG. 4 is a graph showing the AC bias voltage required for a constant change in capacitance for low dopant and high dopant density materials being probed. The AC bias voltage varies between V(l) for low density substrate material, and V(h) for high density substrate material.

Figure 5A:
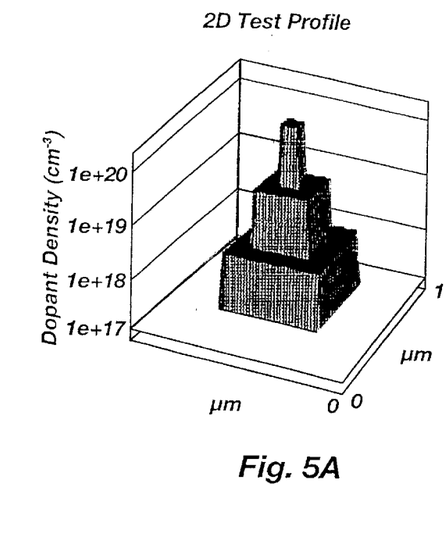
FIG. 5A is a graph of a two dimensional test dopant density profile.

FIGS. 5A, 5B, 5C and 5D are also provided to illustrate what is achieved by inverse modeling in two dimensions. It is noted that the presently preferred embodiment achieves increased stability at low dopant densities by improvement in the inversion algorithm. FIG. 5A is a graph of a two dimensional test dopant density profile.

Figure 5B:
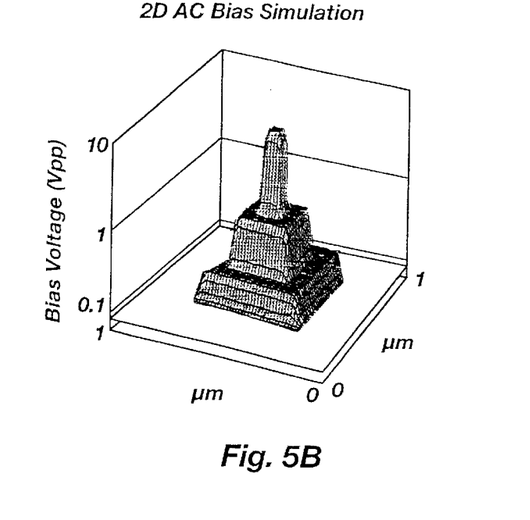
FIG. 5B is a graph of a two dimensional AC bias voltage simulation.

FIG. 5B is a graph of a two dimensional AC bias voltage simulation.

Figure 5C:
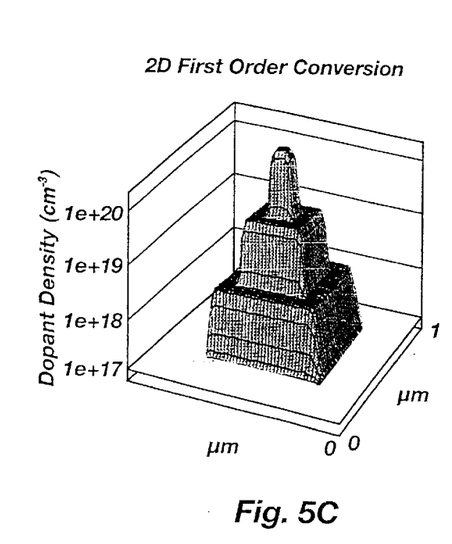
FIG. 5C is a graph of a two dimensional first order conversion of a dopant density profile.

FIG. 5C is a graph of a two dimensional first order conversion of a dopant density profile.

Figure 5D:
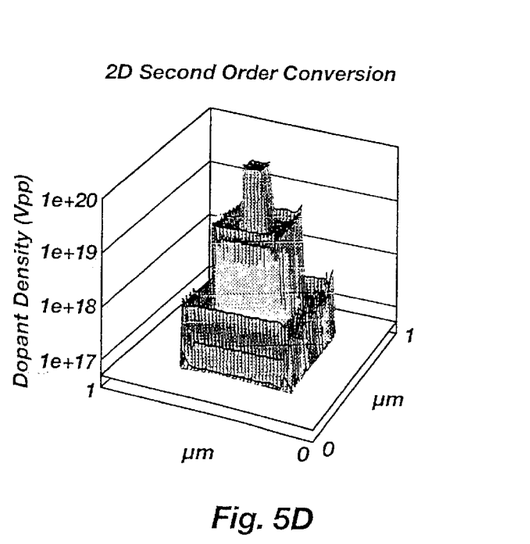
FIG. 5D is a graph of a two dimensional second order conversion of a dopant density profile.

FIG. 5D is a graph of a two dimensional second order conversion of a dopant density profile.

Some important considerations when utilizing the presently preferred embodiment should also be remembered. The method uses the same physical model except that the annular rings are divided into sections of equal area. The dopant density for each section is found by interpolating between dopant points of the input data. If a section of an annular ring is outside of the input dopant grid as happens near the grid edges, the dopant density can either be taken as the value found at the edge, or it can be extrapolated using the dopant gradient at the edge. The user of the present invention should choose the case that is most appropriate. The locked change-in-capacitance is found by choosing a location (dopant distribution) and assigning an AC bias voltage to that point, and summing the capacitive contribution for each section of each annular ring. The subsequent AC bias voltage for each point is then found by varying the AC bias voltage until the calculated capacitance is equal to the locked capacitance.

The preferred embodiment uses inverse simulation to enhance the dopant resolution obtained by the Scanning Probe Microscope to better than one probe tip radii.

For the preferred embodiment to be useful, the algorithms for calculating the dopant density profile must be executed quickly. The most time consuming part of the algorithms are the calculation of the capacitance of the silicon substrate. This capacitance depends on four parameters: the applied bias, the sensor probing voltage, the tip-to-silicon capacitance, and the dopant density. Calculating the silicon capacitance at discrete values of the input parameters and storing the results in an ordered array creates a look-up table. The value of the silicon capacitance for any set of parameters is found by matching these parameters with the closest from the set of discrete values used in the look-up table, taking the resulting capacitances and interpolating on them to find the value of the desired silicon capacitance. This method is significantly faster than the direct calculation of the silicon capacitance. The algorithm described is included within the program which is included with this document as Microfiche Appendix.

It is important to the preferred embodiment to have a good estimate of the tip size and shape, because the inverse modeling outcome will depend upon an accurate tip representation. The preferred embodiment can also be used to determine the size and shape of the probe tip if the substrate being imaged has a well known dopant density profile.

In terms of quantitative results, the preferred embodiment has been shown to improve the spatial resolution of the Scanning Probe Microscope for quantitative two dimensional dopant profiling. The effect of the iterative approach is to sharpen the dopant density profile in regions of the substrate where the finite size of the probe tip has been broadened by the measured AC bias voltage data. It is noted that it also possible to achieve similar improvements using matrix methods.

In an alternative embodiment, another method for arriving at a desired dopant density profile would be to arrive at the convergence value where it is different for different areas of the dopant density profile. If the dopant density profile was not updated, then the modified (corrected) dopant density profile is now the second order approximation to the true dopant density which the method of the present invention is trying to obtain.

However, if an adjustment to the dopant density profile is indicated, the dopant density is adjusted at each point based upon the magnitude and the sign of the error signal at that specific point.

Another alternative embodiment of the present invention which would enable a user to determine if this iterative algorithm has produced a result with the desired accuracy is to compare the currently generated dopant profile with the dopant profile from the previous iteration. If the difference in these profiles is less than a user defined convergence criteria over a user defined range in the dopant profile, the algorithm has produced a dopant profile with the desired spatial resolution and accuracy.

All of the embodiments described above utilize an iterative process. These iterative methods for improving the spatial resolution and accuracy of scanning probe microscopies can be applied to one, two or even three dimensional measurements. The acquired data from the Scanning Probe Microscope and the generated model must be of the same or greater dimensionality as the desired dopant density profile that is to be enhanced.

Before examining a different approach to dopant density profiling that also uses an iterative process, it should be mentioned that other types of microscopes can also be used other than the Scanning Probe Microscope. However, the following list of microscopes should only be considered exemplary of the microscopes that can be used. This exemplary list includes the Near Field Scanning Optical Microscope (NSOM), the Scanning Tunneling Microscope, the Atomic Force Microscope (AFM), the Scanning Thermal Profiler Microscope, and the Electrostatic Force Microscope. The scope of the patent should therefore be considered accordingly.

It was explained above that the presently preferred embodiment of the present invention utilizes scanning which is executed in accordance with constant change in capacitance mode. However, this method can also be applied to data obtained from the Scanning Probe Microscope when it is operating in a mode wherein the AC bias voltage applied to the substrate is held constant and the signal is the change in depletion capacitance.

In step one of this alternative embodiment, the tip of the probe is scanned over the two-dimensional surface of the substrate material being probed. This scanning is executed in accordance with the constant AC bias voltage mode, in contrast to the constant capacitance mode.

The second step is to take measurements of the change in capacitance. This is done to obtain a corresponding probe capacitance signal. The change in capacitance measurements are recorded as a function of the position of the probe on the surface of the substrate.

These first two steps are executed to thereby experimentally acquire change-in-capacitance data to be input into a first order model which assumes uniform dopant density under the probe at each point on the substrate material.

The third step is also in accordance with the state of the art method. A conversion of the probe capacitance signal measured in step two is executed to obtain a two dimensional dopant density profile, using the first order model. This provides a first order approximation of the true dopant density that is being measured.

The first new step (step four) of this alternative embodiment of the present invention is to use a second order model to calculate a new change-in-capacitance for first order dopant density. This is accomplished using the new two dimensional gradient model of the probe tip interaction with the substrate surface. This new model also breaks the annular rings of dopant density into finite segments as shown in FIGS. 3A and 3B. Therefore, this fourth step uses the first order approximation of the dopant distribution as an input in the second order model to calculate the new change-in-capacitance.

Accordingly, the second order model of the probe (virtual probe) is used to obtain a virtual measurement as the virtual probe is scanned over the dopant density profile (the first order approximation of the dopant distribution).

The fifth step is to compare this newly calculated change-in-capacitance with the experimentally acquired (measured) change in capacitance from step two. The dopant density profile is then adjusted according to the percent difference between the two changes in capacitance. Specifically, the signal of the virtual probe is compared with the measured probe signal. The percent difference between the signals is referred to as an error signal.

The step of adjusting the dopant density profile is accomplished by comparing the magnitude of the error signal at each point to a user defined convergence value. If the error signal at each point (or some average value) is smaller than a predetermined convergence value, the method is complete and the dopant density profile is as accurate as the user required. However, if the error signal is greater than the convergence measure, an adjustment is made to the dopant density profile based upon the error signal at each point.

It is notable that the user can determine whether the convergence value must be greater for each point, or some user determinable average value can be used. It is conceivable that the convergence value might even change for different areas of the dopant density profile. If the dopant density profile was not updated, then the modified (corrected) dopant density profile is now the second order approximation to the true dopant density which the present invention is trying to obtain.

However, if an adjustment to the dopant density profile is indicated, the dopant density is adjusted at each point based upon the magnitude and the sign of the error signal at that specific point.

This alternative embodiment of the present invention also takes an iterative approach to converging on a correct dopant density profile, where correctness is defined as whatever convergence measure the user desires. Therefore, once the dopant density profile is modified, the method of the present invention keeps returning to the first new step (step four) of this alternative embodiment of the present invention until the error signal is less than the convergence measure.

There are some significant aspects of the present invention which are useful to learn at this point of the description. For example, the presently preferred method of the present invention can be applied to other types of scanning probe microscopies for which a model of the interaction between a probe and the substrate material can be created. A first order model which assumes no gradient near a probe tip can be used to initially make a first order approximation at the true profile. Then a second order model which includes a local gradient near the probe tip can be used to iteratively improve the second order profiles until convergence is obtained. In other words, this iterative method can be applied to many different microscopes. What is important to consider is that an iterative process to enhance spatial resolution and accuracy of dopant density profiling is a novel method for improving spatial resolution and accuracy in microscopy in general.

Figure 6:
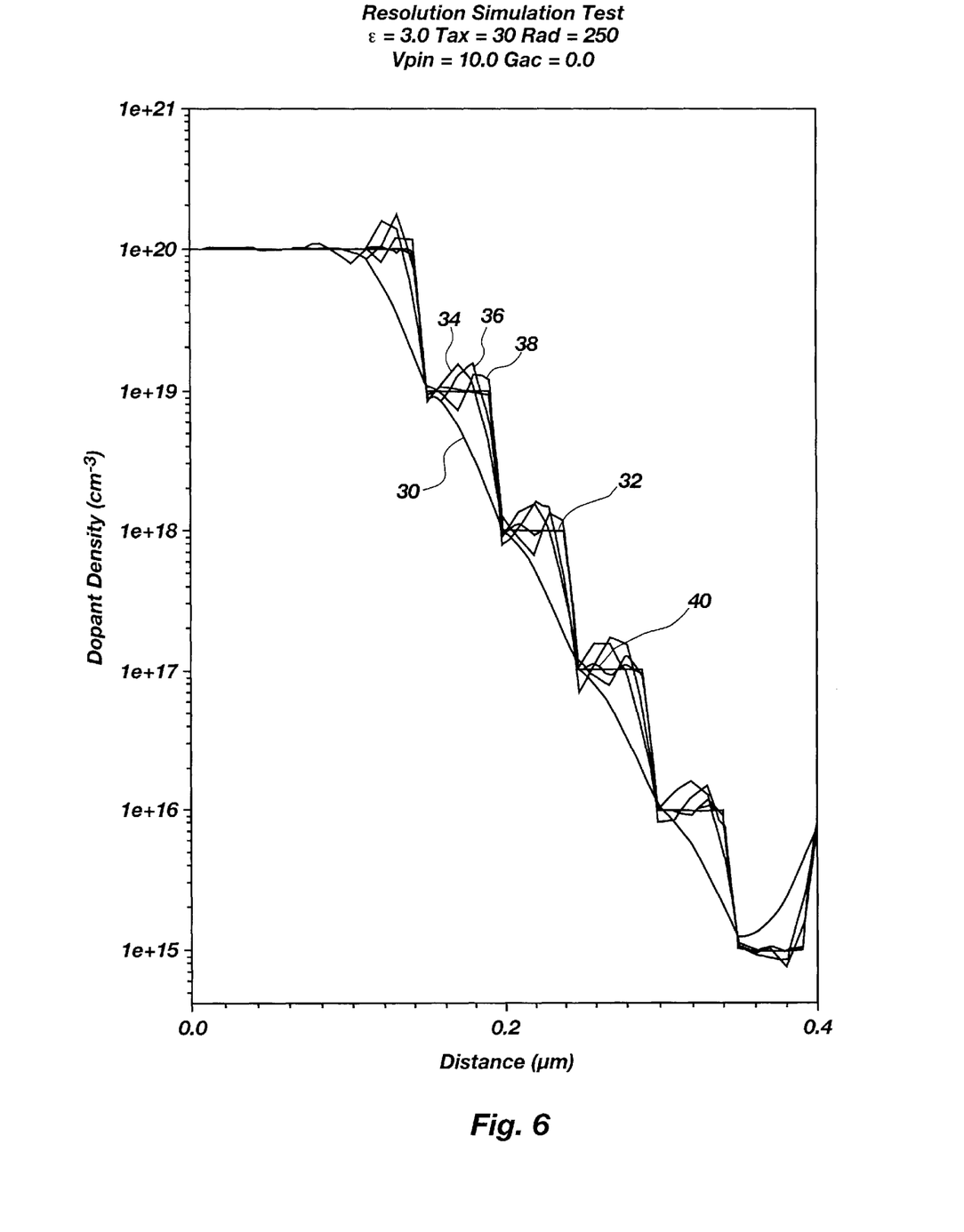
FIG. 6 is a graph showing that the dopant density profile for the first order model suffers in accuracy when compared to the true dopant density profile. This figure also shows iterative steps which are converging on the true dopant density profile.

FIG. 6 shows another important aspect of the invention. This figure is provided to show test results obtained when utilizing the method of the present invention. The graph shows that the dopant density profile for the first order model (line 30) suffers in accuracy when compared to the true dopant density profile (line 32, which can be thought of as generally a step function). Lines 34, 36 and 38 all show iterative steps which are converging on the true dopant density profile. Finally, step 79 (line 40) is difficult to distinguish from the true dopant density profile 32, but it wavers slightly about it, thereby confirming the intent of the present invention.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A method for determining a dopant density profile of a material with respect to at least two dimensions, said method comprising the steps of:
   (1) moving a fine tip of a probe in close proximity to a surface of the material within a predetermined area of movement;
   (2) applying an AC bias voltage to the fine tip;
   (3) measuring the AC bias voltage required to thereby maintain a constant capacitance change on the fine tip at a plurality of points relative to the material;
   (4) calculating a virtual AC bias voltage profile which accounts for variations in dopant density near the fine tip; and
   (5) iteratively approaching a dopant density profile of the material by comparing the measured AC bias voltage to the virtual AC bias voltage profile generated for the plurality of points.

2. The method as defined in claim 1 wherein the method further comprises the step of converting the measured AC bias voltage to a first dopant density profile using a first order AC bias voltage to dopant density model which does not account for dopant gradients in the material.

3. The method as defined in claim 2 wherein the method further comprises the step of calculating the virtual AC bias voltage profile utilizing the first order dopant density profile as an input in a second order model which accounts for variations in dopant density near the fine tip.

4. The method as defined in claim 1 wherein the method further comprises the step of comparing the measured AC bias voltage against the calculated virtual AC bias voltage profile to thereby obtain an error signal having a magnitude and a sign.

5. The method as defined in claim 4 wherein the method further comprises the steps of:
   (1) determining if the error signal exceeds a user selectable measure of convergence at each of the plurality of points; and
   (2) adjusting the dopant density profile at each of the plurality of points in accordance with the error signal if the user selectable measure of convergence is exceeded, or repeating step (1) for a next one of the plurality of points if the measure of convergence is not exceeded.

6. The method as defined in claim 5 wherein the method further comprises the step of returning to the step of comparing the measured AC bias voltage against the calculated virtual AC bias voltage profile until the measure of convergence is greater than the error signal for each of the plurality of points of the material.

7. The method as defined in claim 1 wherein the method further comprises the step of coupling the probe to a Scanning Probe Microscope.

8. The method as defined in claim 1 wherein the method further comprises the step of selecting the probe to be coupled to a microscope selected from the group of microscopes consisting of a Near Field Scanning Optical Microscope (NSOM), a Scanning Tunneling Microscope, an Atomic Force Microscope (AFM), a Scanning Thermal Profiler Microscope, and an Electrostatic Force Microscope.

9. The method as defined in claim 1 wherein the method further comprises the step of selecting the material for which the dopant density profile is being generated to be a semiconductive material.

10. The method as defined in claim 9 wherein the method further comprises the step of selecting the semiconductive material to be silicon.

11. The method as defined in claim 5 wherein the method further comprises the step of selecting a plurality of different user selectable convergence values for different areas of the dopant density profile.

12. The method as defined in claim 1 wherein the method further comprises the steps of:
   (1) storing a first dopant density profile for a selected one of the plurality of points;
   (2) iteratively generating a second dopant density profile for the selected one of the plurality of points;
   (3) determining a difference between the first dopant density profile and the second dopant density profile; and
   (4) determining if the difference exceeds a user selectable measure of convergence at the selected one of the plurality of points.

13. A method for enhancing a dopant density profile of a doped material using scanning probe microscopy to thereby obtain improved accuracy and spatial resolution, said method comprising the steps of:
   (1) measuring a harmonic AC bias voltage required to maintain a constant capacitance change as a function of position of a scanning probe at a plurality of points on the doped material;
   (2) converting the measured AC bias voltage to a first order dopant density profile using a first order AC bias voltage to dopant density model;
   (3) calculating a new virtual AC bias voltage profile utilizing the first order dopant density profile as an input in a second order model which accounts for variations in dopant density near the scanning probe at any given point;
   (4) comparing the new AC bias voltage with the experimentally acquired AC bias voltage from step two to thereby obtain an error signal having magnitude and sign;
   (5) adjusting the dopant density profile at each of the plurality of points in accordance with the error signal if the error signal exceeds a selectable convergence measure; and
   (6) repeating steps three through five until the convergence measure is greater than the error signal.

14. A method for determining a dopant density profile of a material with respect to at least two dimensions, said method comprising the steps of:
   (1) moving a fine tip of a probe in close proximity to a surface of the material within a predetermined area of movement;
   (2) applying a depletion capacitance to the fine tip to thereby maintain a constant AC bias voltage;
   (3) measuring the depletion capacitance required to thereby maintain the constant AC bias voltage on the fine tip at a plurality of points relative to the material;
   (4) calculating a virtual depletion capacitance profile which accounts for variations in dopant density near the fine tip; and
   (5) iteratively approaching a dopant density profile of the material by comparing the measured depletion capacitance to the virtual depletion capacitance profile generated for the plurality of points.

15. The method as defined in claim 14 wherein the method further comprises the step of converting the measured depletion capacitance to a first dopant density profile using a first order depletion capacitance to dopant density model which does not account for dopant gradients in the material.

16. The method as defined in claim 15 wherein the method further comprises the step of calculating the virtual depletion capacitance profile utilizing the first order dopant density profile as an input in a second order model which accounts for variations in dopant density near the fine tip.

17. The method as defined in claim 14 wherein the method further comprises the step of comparing the measured depletion capacitance against the calculated virtual depletion capacitance profile to thereby obtain an error signal having a magnitude and a sign.

18. The method as defined in claim 17 wherein the method further comprises the steps of:

(1) determining if the error signal exceeds a user selectable measure of convergence at each of the plurality of points; and (2) adjusting the dopant density profile at each of the plurality of points in accordance with the error signal if the user selectable measure of convergence is exceeded, or repeating step (1) for a next one of the plurality of points if the measure of convergence is not exceeded.

19. The method as defined in claim 18 wherein the method further comprises the step of returning to the step of comparing the measured depletion capacitance against the calculated virtual depletion capacitance profile until the measure of convergence is greater than the error signal for each of the plurality of points of the material.

20. The method as defined in claim 14 wherein the method further comprises the step of coupling the probe to a Scanning Probe Microscope.

21. The method as defined in claim 14 wherein the method further comprises the step of selecting the probe to be coupled to a microscope selected from the group of microscopes consisting of a Near Field Scanning Optical Microscope (NSOM), a Scanning Tunneling Microscope, an Atomic Force Microscope (AFM), a Scanning Thermal Profiler Microscope, and an Electrostatic Force Microscope.

22. The method as defined in claim 14 wherein the method further comprises the step of selecting the material for which the dopant density profile is being generated to be a semiconductive material.

23. The method as defined in claim 9 wherein the method further comprises the step of selecting the semiconductive material to be silicon.

24. The method as defined in claim 18 wherein the method further comprises the step of selecting a plurality of different user selectable convergence values for different areas of the dopant density profile.

25. The method as defined in claim 1 wherein the method further comprises the steps of:

(1) storing a first dopant density profile for a selected one of the plurality of points;

(2) iteratively generating a second dopant density profile for the selected one of the plurality of points;

(3) determining a difference between the first dopant density profile and the second dopant density profile; and (4) determining if the difference exceeds a user selectable measure of convergence at the selected one of the plurality of points.

26. A method for enhancing a dopant density profile of a doped material using scanning probe microscopy to thereby obtain improved accuracy and spatial resolution, said method comprising the steps of:

(1) measuring a depletion capacitance required to maintain a constant AC bias voltage as a function of position of a scanning probe at a plurality of points on the doped material;

(2) converting the measured depletion capacitance to a first order dopant density profile using a first order depletion capacitance to dopant density model;

(3) calculating a new virtual depletion capacitance profile utilizing the first order dopant density profile as an input in a second order model which accounts for variations in dopant density near the scanning probe at any given point;

(4) comparing the new depletion capacitance with the experimentally acquired depletion capacitance from step two to thereby obtain an error signal having magnitude and sign;

(5) adjusting the dopant density profile at each of the plurality of points in accordance with the error signal if the error signal exceeds a selectable convergence measure; and (6) repeating steps three through five until the convergence measure is greater than the error signal.

* * * * *